United States Patent
Gardner et al.

[11] Patent Number: 6,117,760
[45] Date of Patent: Sep. 12, 2000

[54] METHOD OF MAKING A HIGH DENSITY INTERCONNECT FORMATION

[75] Inventors: Mark I. Gardner, Cedar Creek; H. Jim Fulford, Jr.; Fred N. Hause, both of Austin, all of Tex.

[73] Assignee: Advanced Micro Devices, Inc., Sunnyvale, Calif.

[21] Appl. No.: 08/968,682

[22] Filed: Nov. 12, 1997

[51] Int. Cl.$^7$ .............................................. H01L 21/4763
[52] U.S. Cl. ..................... 438/618; 438/622; 438/597; 438/598; 438/625; 438/639; 438/629; 438/631; 438/633; 438/675; 438/669; 438/672
[58] Field of Search ...................................... 438/618, 622, 438/597, 598, 625, 639, 629, 631, 633, 675, 669, 672

[56] References Cited

U.S. PATENT DOCUMENTS

| | | | |
|---|---|---|---|
| 5,017,515 | 5/1991 | Gill | 437/229 |
| 5,767,012 | 6/1998 | Fulford, Jr. et al. | 438/622 |
| 5,888,872 | 3/1999 | Gardner et al. | 438/300 |
| 5,926,700 | 7/1999 | Gardner et al. | 438/152 |

*Primary Examiner*—John F. Niebling
*Assistant Examiner*—Lynne A. Gurley
*Attorney, Agent, or Firm*—Kevin L. Daffer; Conley, Rose & Tayon

[57] ABSTRACT

A technique is provided for forming interconnects laterally spaced from each other across a semiconductor topography by a deposited dielectric spacer layer. The lateral distance between each interconnect is advantageously dictated by the thickness of the spacer layer rather than by the minimum feature size of a lithographically patterned masking layer. In an embodiment, a first and second conductive interconnects are formed a spaced distance apart upon a semiconductor topography. The first and second interconnects are defined using optical lithography and an etch technique. A dielectric layer is CVD deposited across the exposed surfaces of the first and second interconnects and of the semiconductor topography. The CVD deposition conditions are controlled so as to form a relatively thin spacers laterally adjacent the sidewalls of the interconnects. A conductive material is then deposited across into a trench arranged between the first and second interconnects, and CMP polished such that the upper surface of the conductive material is at an elevational level proximate that of the surfaces of the interconnects. A third interconnect is thereby formed within the trench laterally adjacent the first and second interconnects.

26 Claims, 2 Drawing Sheets

6,117,760

METHOD OF MAKING A HIGH DENSITY INTERCONNECT FORMATION

BACKGROUND OF THE INVENTION

1. Field of the Invention

The invention relates to the field of semiconductor processing and more particularly to a method for decreasing the spacing between interconnect structures in an interconnect level.

2. Description of the Relevant Art

Integrated circuits typically include numerous conductors extending across the topography of a semiconductor. Conductors generally extend partially parallel to each other across the semiconductor topography. The conductors are isolated from each other and from underlying conductive elements by a dielectric, a suitable dielectric being, for example, silicon dioxide ("oxide"). Conductors are thereby lithographically patterned across the semiconductor topography, wherein the topography comprises a substrate with a dielectric placed thereon. Conductors are made from an electrically conductive material, a suitable material including Al, Ti, Ta, W, Mo, polysilicon, or a combination thereof. The substrate includes any type of material which can retain dopant ions and the isolated conductivity regions brought about by those ions. Typically, the substrate is a silicon-based material which receives p-type or n-type ions. Generally speaking, interconnect lines (or conductors) are fashioned upon the topography and dielectrically spaced above an underlying conductor or substrate. Each conductor is dielectrically spaced from other conductors within the same level of conductors (i.e., substantially coplanar conductors) by a defined lateral distance. Each conductor is designed to carry a certain amount of current, based on the desired design and application.

FIG. 1 illustrates interconnects 12 arranged upon a semiconductor topography 10, according to conventional design. Semiconductor topography 10 may include, e.g., an interlevel dielectric arranged above a semiconductor substrate. Interconnects 12 have been formed by depositing a conductive material across semiconductor topography 10, and thereafter etching regions of the conductive material from above topography 10. A photoresist masking layer had been patterned across the conductive material using optical lithography to define those regions of the conductive material to be removed. The regions of the conductive material exposed by the masking layer had been attacked during the etch technique. The masking layer, being resistant to attack by etchants, had effectively protected the underlying conductive material from being etched away. Unfortunately, the minimum lateral width $l_1$ of each interconnect 12 and the minimum lateral distance $l_2$ between a pair of the interconnects 12 is limited by the minimum feature size of the masking layer. Several factors affect the minimum dimensions of the masking layer features. One of these factors is the resolution, i.e., the ability to distinguish closely spaced objects, of the optical lithography system used to pattern the masking layer. The number of conductors arranged within a unitary level of an integrated circuit is limited by the dimension of each conductor and the distance between adjacent conductors. Therefore, the packing density of the conductors is somewhat sacrificed by the use of optical lithography to define the size of and spacing between the conductors.

As the complexity of integrated circuits has increased, an ever increasing number of interconnects are required to achieve the selective coupling of the transistors necessary to implement the desired circuit. The increase in the number of required interconnects, coupled with the minimum spacing tolerable between adjacent interconnect, has typically necessitated the use of multiple interconnect levels as described previously. Each additional interconnect level added to a semiconductor process increases the complexity, cost, and time required to produce a single integrated circuit. Therefore, it would be desirable to implement a semiconductor process that enables a decrease in spacing or an increase in the density at which the interconnects within a unitary interconnect level are spaced across an underlying topography.

SUMMARY OF THE INVENTION

The problems identified above are in large part addressed by a semiconductor fabrication process in which a third interconnect is formed intermediate between a first and second interconnect, wherein the first, second, and third interconnects are separated by a thin dielectric layer, such as a sidewall spacer structure formed on the first and second interconnect prior to the formation of the third interconnect. In this manner, the spacing intermediate between adjacent interconnects within an interconnect level is not constrained by the resolution limits of a piece of photolithography equipment. The third interconnect is self-aligned between the sidewall spacer structures arranged laterally adjacent to the first and second interconnects. Thus, the lateral thickness of the spacer structures dictates the lateral distance between adjacent interconnects.

Broadly speaking, the present invention contemplates a semiconductor process in which an interconnect level is formed on an upper surface of the semiconductor substrate. The interconnect level includes a first interconnect and a second interconnect. The dielectric layer is then deposited over the topography comprised of the substrate and the interconnect level. Preferably, the dielectric layer is conformal and includes a pair of spacer structures in contact with opposing sidewalls of the first and second interconnects. A conductive material is then deposited to fill the trench between the pair of spacer structures. The conductive material is then planarized by removing portions of the conductive material exterior to the trench until the portion of the conductive material occupying the trench is isolated from remaining portions of the conductive material. In this manner, a third interconnect is formed intermediate between the first and second interconnect wherein the third interconnect comprises the portion of the conductive material occupying the trench.

Preferably, the formation of the interconnect level is accomplished by depositing a first conductive material on an upper surface of the semiconductor substrate to form a conductive layer, forming a patterned mask on the conductive layer to expose portions of the conductive layer, and removing the exposed portions of the conductive layer with a plasma etch process. In one embodiment, the depositing of the first conductive material is accomplished using a sputter deposition process or other suitable physical vapor deposition process. The first conductive material is preferably comprised of aluminum, copper, tungsten, silicon, or an appropriate alloy thereof. The preferred process for depositing the dielectric layer comprises depositing a silicon dioxide using a TEOS or silane source in a plasma enhanced chemical vapor deposition reactor chamber maintained at a temperature in the range of approximately 200 to 500° C. and a pressure of less than approximately 2 torr. In this embodiment, the dielectric layer is substantially conformal over a topography comprising the interconnect layer and the semiconductor substrate. A thickness of the dielectric layer on the sidewalls of the first and second interconnect is suitably in the range of approximately 200 to 1500 angstroms. In one embodiment, the formation of the dielectric layer further includes the step of depositing silicon nitride across the CVD silicon dioxide. The deposition of the silicon nitride, in the preferred embodiment, comprises reacting ammonium and silane in a CVD reactor chamber maintained at a temperature in the range of less than approximately 500° C. at a pressure of less than approximately 2 torr.

The step of planarizing the filler conductive material is accomplished preferably using a chemical mechanical polish. In one embodiment, a separation between the first and third interconnect is less than approximately 50% of a width of the first interconnect. In one embodiment, a separation between the first and third interconnect is less than approximately 0.2 microns. After the planarization of the conductor material, portions of the conductive material exterior to the trench are removed using a mask and etch process in a presently preferred embodiment.

The present invention still further contemplates a semiconductor process in which an interconnect level is formed on an upper surface of a semiconductor substrate. The interconnect level includes a first interconnect and a second interconnect, wherein the first and second interconnect include opposing sidewall surfaces. A spacer layer is then deposited over a topography comprising the semiconductor substrate and the interconnect level. An anisotropic plasma etch process is then performed on the spacer layer to form spacer structures upon the sidewall surfaces of the first and second interconnect structures. The conductive material is then deposited across the first and second interconnect structures and into a trench existing between the spacer structures. The conductive material is then removed down to a level commensurate with the upper surfaces of the interconnect structures, thereby forming a third interconnect within the trench.

BRIEF DESCRIPTION OF THE DRAWINGS

Other objects and advantages of the invention will become apparent upon reading the following detailed description and upon reference to the accompanying drawings in which.

Figure 1:
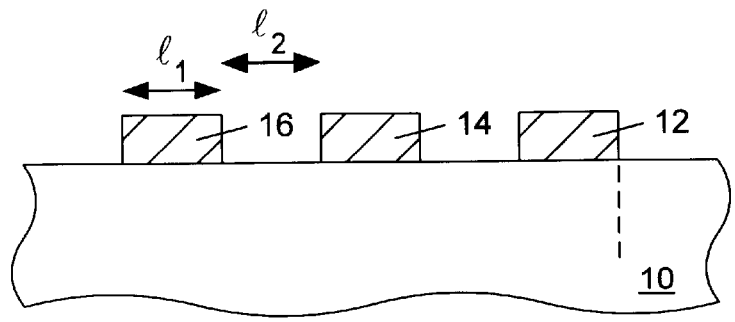
FIG. 1 is a partial cross-sectional view of an interconnect level including first, second and third interconnects formed using a conventional photomask and etch process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 2:
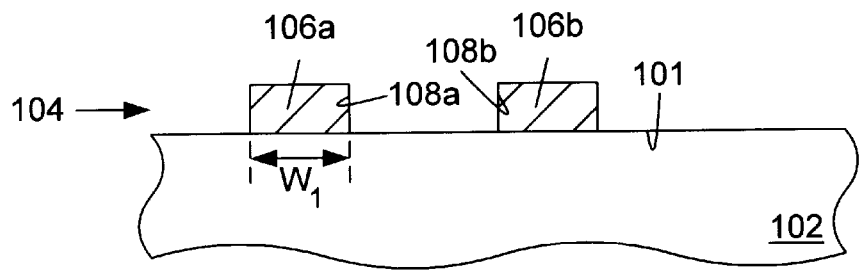
FIG. 2 is a partial cross-sectional view of a semiconductor substrate upon which a first interconnect level including first and second interconnects has been formed.

Turning now to FIGS. 2 through 7, a presently preferred embodiment of the processing sequence used to form a high density interconnect level is shown. In FIG. 2, an interconnect level 104 including a first interconnect 106a and a second interconnect 106b has been formed on upper surface 101 of semiconductor substrate 102. Semiconductor substrate 102 includes, in the preferred embodiment, a single crystal silicon wafer upon which a plurality of transistors have been fabricated. In addition, semiconductor substrate 102 may include previous interconnect levels and interlevel dielectric layers. Interlevel dielectric layers separate the various interconnect levels and include via or contact structures filled with conductive material to selectively couple the various interconnect levels and the transistor level. A presently preferred starting material for semiconductor substrate 102 in an embodiment useful in the fabrication of CMOS integrated circuits includes a p-type epitaxial layer formed over a p+ silicon bulk wherein a resistivity of the p-type epitaxial layer is in the range of approximately 10–15 Ω-cm.

Interconnect level 104 is preferably fabricated by depositing a first conductive material on an upper surface 101 of semiconductor substrate 102 to form a conductive layer. A patterned mask preferably comprised of photoresist is then formed on an upper surface of the conductive layer to expose portions of the conductive layer. The exposed portions of the conductive layer are then removed with the plasma etch process leaving behind the first and second interconnects 106a and 106b shown in FIG. 2. Preferably, the deposition of the first conductive material is accomplished using a sputter deposition process or other suitable physical deposition techniques such that the first conductive material is blanket deposited over upper surface 101 of semiconductor substrate 102. In a presently preferred embodiment, the first conductive material (and, therefore, first and second interconnects 106a and 106b) is comprised of aluminum, copper, tungsten, silicon or an appropriate alloy thereof. The plasma etch process preferably used to etch the first conductive material results in substantially vertical sidewalls on first and second interconnects 106a and 106b including opposing sidewalls 108a and 108b. The cross sectional width of first and second interconnects 106a and 106b is represented by the $w_1$ designation. To achieve the highest density, it is contemplated that $w_1$ is less than one micron and in one presently preferred embodiment, is in the range of approximately 0.6 to 0.9 microns.

Figure 3:
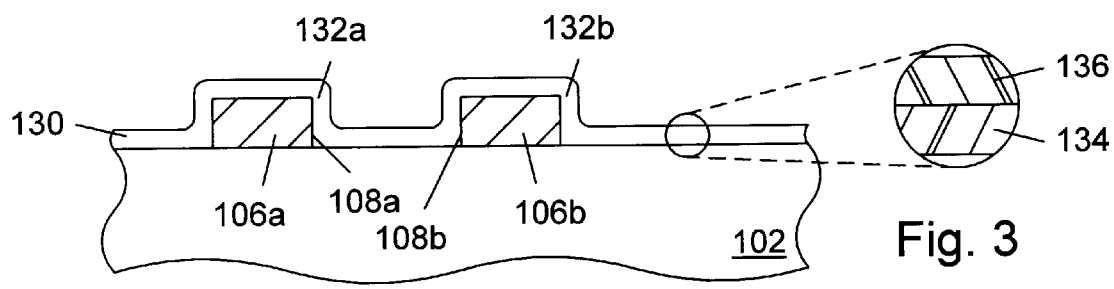
FIG. 3 is a processing step subsequent to FIG. 2 in which a substantially conformal dielectric layer has been deposited over the semiconductor substrate topography.

Turning now to FIG. 3, a dielectric layer 130 is deposited over the topography of semiconductor substrate 102 (including the first interconnect level 104). Preferably, dielectric layer 130 is substantially conformal to the underlying topography. For purposes of this disclosure, a conformal dielectric layer refers to a dielectric layer having a thickness which varies less than approximately 10 to 20% over the underlying topography. A suitably conformal dielectric layer is fabricated in a presently preferred embodiment with a plasma enhanced chemical vapor deposition process in which CVD silicon dioxide is deposited using a TEOS or silane source typically within a CVD reactor that is maintained at temperature in the range of approximately 200 to 500° C. at a pressure of less than approximately 2 torr. Because semiconductor substrate 102 may include previous interconnect levels, e.g., previous aluminum interconnect levels, the process used to deposit dielectric layer 130 is preferably performed at a temperature of less than approximately 600° C. and still more preferably at a temperature approximately 450° C. Preferably, a thickness of dielectric layer 130 on sidewalls 108a and 108b of first and second interconnects 106 is in the range of approximately 200 to 1500 angstroms. In an embodiment shown in the inset of FIG. 3, dielectric layer 130 includes a composite structure comprising of a CVD silicon dioxide layer 134 and a subsequently deposited silicon nitride layer 136. Silicon dioxide layer 134 may be formed as described above. The deposition of silicon nitride layer 136 is preferably accomplished by reacting ammonium and silane in a CVD reactor chamber maintained in the range of less than approximately 500° C. at a pressure of less than approximately 2 torr. As deposited, dielectric layer 130 includes spacer structures 132a and 132b. The spacer structures refer to the portion of dielectric layer 130 in contact with opposing sidewalls 108a and 108b of first and second interconnects 106a and 106b, respectively.

Figure 4A:
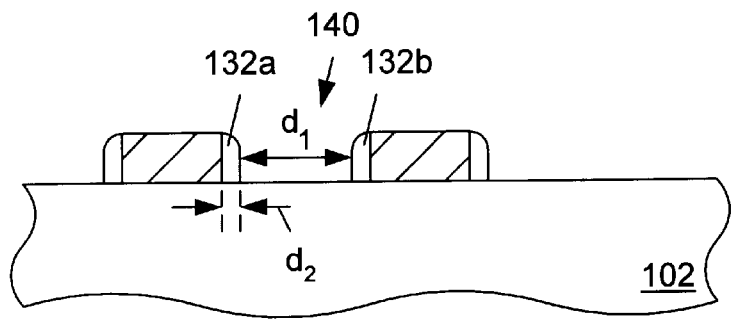
FIG. 4a is a processing step subsequent to FIG. 3 in which the conformal dielectric layer has been subjected to an anisotropic plasma etch process to create spacer structures on opposing sidewalls of the first and second interconnect.
Figure 4B:
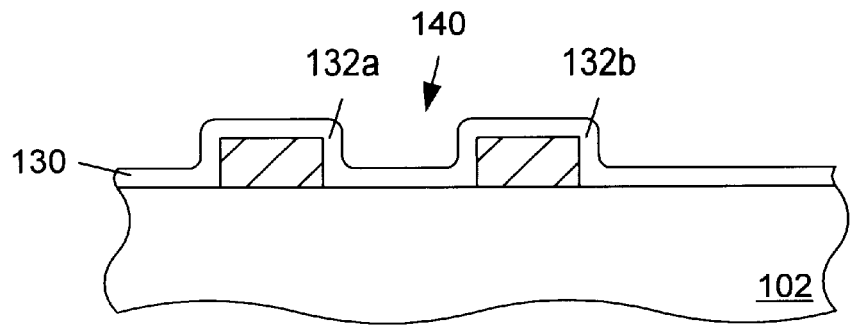
FIG. 4b is an alternative embodiment in which the dielectric layer is not subjected to an anisotropic etch process after the deposition of the dielectric layer.

Turning now to FIGS. 4a and 4b, alternative embodiments of the present invention are shown. In FIG. 4a, dielectric layer 130 has been anisotropically etched, preferably using a plasma etch process, to form spacer structures on the sidewalls of the first and second interconnects 106a and 106b. The formation of spacer structures by anisotropically etching a conformal layer patterned over an underlying topography will be familiar to those skilled in the art of semiconductor processing. By carefully monitoring the deposition and etch parameters used to produce these spacer structures, the thickness or lateral dimension $d_2$ of the spacer structures can be carefully controlled. In the preferred embodiment, a separation distance $d_1$ between spacer structures 132a and 132b is preferably of approximately the same dimension as the width $w_1$ of the first and second interconnect structure. In the embodiment shown in FIG. 4b, the plasma process is eliminated, leaving the dielectric layer 130 intact. Aside from this discrepancy, it is contemplated that the remaining processing steps are essentially equivalent for both of the embodiments shown in FIGS. 4a and 4b. For the sake of simplicity, drawings are shown for the remaining processing sequence using the embodiment depicted in FIG. 4a.

Figure 5:
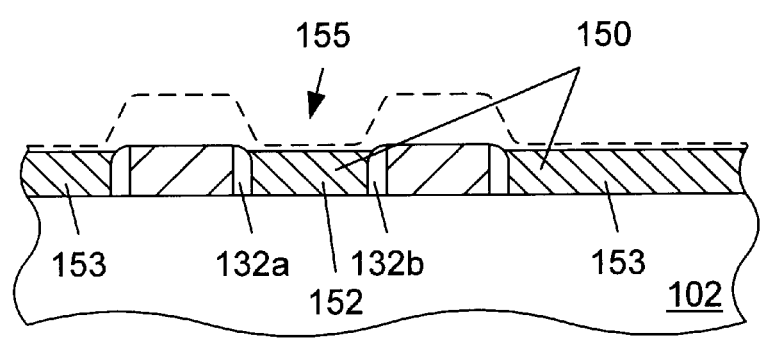
FIG. 5 is a processing step subsequent to FIG. 4a or 4b in which a conductive material has been deposited over the semiconductor substrate topography to fill a trench formed between the spacer structure of the first and second interconnect.

Turning now to FIG. 5, a conductive material 150 is deposited over the semiconductor substrate 102 to fill a trench 140 (shown in FIGS. 4a and 4b) between the spacer structures 132a and 132b. In a presently preferred embodiment, the trench 140 is appropriately filled with a physical vapor deposition process such as a sputter deposition using a target comprising a suitable conductive material such as aluminum, copper, silicon or an appropriate combination thereof. The blanket deposition of the conductive material 150 results in the filling of trench 140 as well as the deposition of conductive material 150 upon regions of the semiconductor topography exterior to the trench 140. For ease of identification, the portion of conductive material 150 residing within trench 140 is defined by reference numeral 152 in FIG. 5 while the portions of conductive material 150 exterior to trench 140 are identified by the reference numeral 153.

It will be appreciated to those skilled in the art that the deposition of conductive material 150 produces conductive material over the first and second interconnect structures 106a and 106b as well as between and around the interconnect structures. To remove the portions of conductive material 150 over the interconnect structures 106a and 106b, a planarization process is performed. In the preferred embodiment, the planarization process results in the isolation of a portion 152 of conductive material 150 from the remaining portions 153. In the preferred embodiment, a suitable planarization process includes a chemical mechanical polish. By isolating portion 152 of conductive material 150 from remaining portions 153, the planarization process results in the formation of a third interconnect structure 155. Third interconnect structure 155 consists simply of the portion 152 of conductive material 150 retained between the spacer structures 132a and 132b. It will be appreciated to those skilled in the art that the formation of the third interconnect structure 155 in the manner described results in a higher achievable metal density. More specifically, in the preferred embodiment, a separation between first and third interconnects 106a and 152, respectively, is less than approximately 50% of a width $w_1$ of first interconnect 106a. Those skilled in the art will recognize that, using a conventional interconnect level formation process, the minimum spacing between adjacent interconnect structures is typically constrained to be equal to the minimum dimension of the interconnect structures themselves. In other words, in a conventional process the minimum spacing between interconnect structures is equal to the minimum width of the structures because a single photolithography aligner defines both the interconnect structures and the space between them. Using the techniques disclosed herein, it is contemplated that a minimum spacing between first interconnect 106a and third interconnect 155 will be less than approximately 0.25 microns in a presently preferred embodiment. Such dense packing of interconnect structures within an interconnect level is plausible because of the ability to control the thickness of the spacer structures 132a and 132b down to a thickness of less than approximately 0.25 microns.

Figure 6:
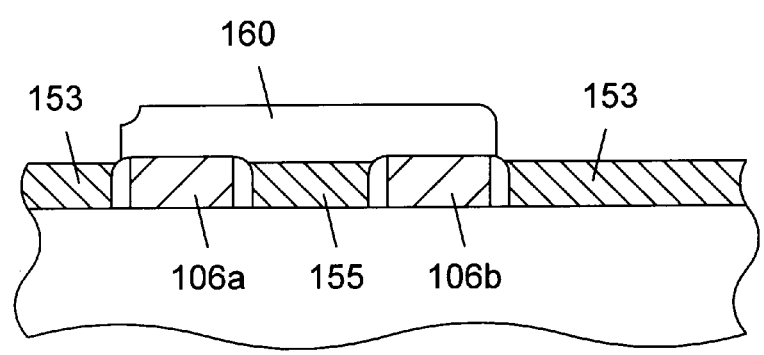
FIG. 6 is a processing step subsequent to FIG. 5 in which a photoresist mask has been patterned over the conductive material within the trench.
Figure 7:
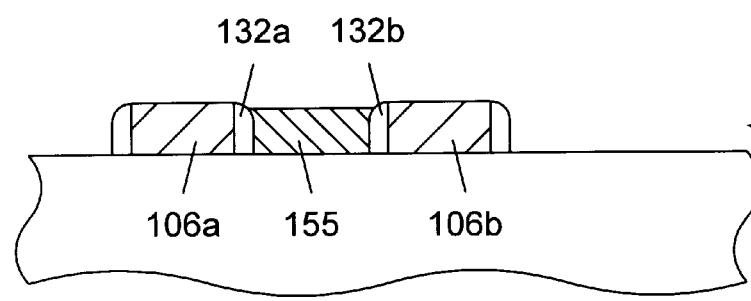
FIG. 7 is a processing step subsequent to FIG. 6 in which portions of the conductive material exterior to the trench formed between the pair of spacer structures has been removed.

Turning now to FIG. 6, a patterned masking layer 160 is formed over the underlying topography. In one embodiment, it is contemplated that it will be desirable to remove the portions 153 of conductive material 150 exterior to trench 140. Accordingly, FIG. 6 depicts the pattern masking layer 160 typically comprised of photoresist material formed using a conventional photolithography/photoresist process. Pattern mask 160 exposes the portions 153 of conductive material 150 exterior to trench 140. A suitable etch process may then be used to remove the portions 153 of conductive material 150 resulting in the cross sectional view depleted in FIG. 7. FIG. 7 depicts first interconnect level 104 including first and second interconnect structures 106a and 106b and a third interconnect structure 155 formed therebetween and separated from the first and second interconnect structures 106a and 106b by spacer structures 132a and 132b, respectively.

It will be appreciated to those skilled in the art having the benefit of this disclosure that the present invention contemplates a method for increasing the density of an interconnect level. Various modifications and changes may be made to each and every processing step as would be obvious to a person skilled in the art having the benefit of this disclosure.

It is intended that the following claims be interpreted to embrace all such modifications and changes and, accordingly, the specification and drawings are to be regarded in an illustrative rather than a restrictive sense.

What is claimed is:

1. A semiconductor fabrication process comprising:
    forming an interconnect level on an upper surface of a semiconductor substrate, wherein said interconnect level comprises a first interconnect laterally spaced from a second interconnect, and wherein said first and second interconnects comprise opposing sidewalls;
    depositing a dielectric layer across a topography comprising said semiconductor substrate and said interconnect level, wherein said dielectric layer comprises spacer structures in contact with said opposing sidewalls of said first and second interconnects;
    depositing a conductive material into a trench arranged between a pair of said spacer structures;
    removing portions of the conductive material such that a remaining portion of the conductive material is isolated within the trench, thereby forming a third interconnect within said trench; and
    removing additional portions of the conductive material external to the trench using a process in which the third interconnect is protected by a mask during removal of the additional portions.

2. The process of claim 1, wherein the step of forming said interconnect level comprises:
    depositing a first conductive material on an upper surface of said semiconductor substrate to form a conductive layer;
    forming a patterned mask on said conductive layer to expose portions of said conductive layer;
    removing said exposed portions of said conductive layer with a plasma etch process.

3. The process of claim 2, wherein said depositing comprises a sputter deposition process.

4. The process of claim 2, wherein said first conductive material comprises a material selected from the group consisting of aluminum, copper, tungsten, silicon, or an appropriate alloy thereof.

5. The process of claim 1, wherein the step of depositing said dielectric layer comprises depositing a silicon dioxide layer from a TEOS or silane source in a plasma enhanced chemical vapor deposition reactor chamber maintained at a temperature in the range of approximately 200 to 500° C. and a pressure of less than approximately 2 torr.

6. The process of claim 5, wherein said dielectric layer is substantially conformal over a topography comprising said interconnect layer and said semiconductor substrate, and wherein a thickness of said dielectric layer on sidewalls of said first and second interconnect is in the range of approximately 200 to 1500 angstroms.

7. The process of claim 5, wherein the step of depositing said dielectric layer further comprises depositing silicon nitride across said silicon dioxide layer.

8. The process of claim 7, wherein said depositing of silicon nitride comprises reacting ammonium and silane in a chemical vapor deposition reactor chamber maintained at a temperature in the range of less than approximately 500° C. and a pressure of less than approximately 2 torr.

9. The process of claim 1, wherein said removing portions comprises chemical mechanical polishing said conductive material.

10. The process of claim 1, wherein a separation between said first and third interconnect is less than approximately 50% of a width of said first interconnect.

11. The process of claim 1, wherein a separation between said first and third interconnect is less than approximately 0.25 microns.

12. The process of claim 1, wherein said removing additional portions of said conductive material comprises:
    forming a photoresist mask over a topography comprising said interconnect level, said dielectric layer, and said conductive material, wherein said photoresist mask exposes portions of said conductive material exterior to said trench;
    removing exposed portions of said conductive material using a plasma etch process; and
    stripping said photoresist mask.

13. A semiconductor fabrication process comprising:
    forming an interconnect level on an upper surface of a semiconductor substrate, wherein said interconnect level includes a first interconnect and a second interconnect, wherein said first and second interconnects include opposing sidewalls;
    depositing a spacer layer over a topography comprising said semiconductor substrate and said interconnect level, wherein the spacer layer is adjacent the semiconductor substrate between the first and second interconnects, and adjacent the sidewalls of the first and second interconnects; and
    while retaining the entirety of the spacer layer, depositing a conductive material into a trench arranged between said first and second interconnects, wherein the trench is surrounded by a portion of the spacer layer, thereby forming a third interconnect within said trench.

14. The process of claim 13, wherein said semiconductor substrate comprises a silicon substrate upon which a transistor level has been fabricated.

15. The process of claim 13, wherein the step of forming said interconnect level comprises:
    depositing a first conductive material on an upper surface of said semiconductor substrate to form a conductive layer;
    forming a patterned mask on said conductive layer to expose portions of said conductive layer; and
    removing said exposed portions of said conductive layer with a plasma etch process.

16. The process of claim 15, wherein said depositing comprises a sputter deposition process.

17. The process of claim 15, wherein said first conductive material comprises a material selected from the group consisting of aluminum, copper, tungsten, silicon, or an appropriate alloy thereof.

18. The process of claim 13, wherein the step of depositing said spacer layer comprises depositing a silicon dioxide layer from a TEOS or silane source in a plasma enhanced chemical vapor deposition reactor chamber maintained at a temperature in the range of approximately 200 to 500° C. and a pressure of less than approximately 2 torr.

19. The process of claim 18, wherein said spacer layer is substantially conformal over a topography comprising said interconnect layer and said semiconductor substrate, and wherein a thickness of said spacer layer on sidewalls of said first and second interconnect is in the range of approximately 200 to 1500 angstroms.

20. The process of claim 18, wherein the step of depositing said spacer layer further comprises depositing silicon nitride across said silicon dioxide layer.

21. The process of claim 20, wherein said depositing of silicon nitride comprises reacting ammonium and silane in a chemical vapor deposition reactor chamber maintained at a temperature in the range of less than approximately 500° C. and a pressure of less than approximately 2 torr.

22. The process of claim 13, further comprising removing portions of the conductive material such that a remaining portion of the conductive material is isolated within the trench to form said third interconnect.

23. A semiconductor fabrication process comprising:

forming an interconnect level on an upper surface of a semiconductor substrate, wherein said interconnect level comprises a first interconnect laterally spaced from a second interconnect, and wherein said first and second interconnects comprise opposing sidewalls;

depositing a dielectric layer across a topography comprising said semiconductor substrate and said interconnect level, wherein said dielectric layer comprises spacer structures in contact with said opposing sidewalls of said first and second interconnects, and wherein said depositing a dielectric layer comprises depositing a silicon dioxide layer over the topography and depositing a silicon nitride layer over the silicon dioxide layer; and depositing a conductive material into a trench arranged between a pair of said spacer structures thereby forming a third interconnect within said trench.

24. The process as recited in claim 23, further comprising removing portions of the conductive material such that a remaining portion of the conductive material is isolated within the trench to form said third interconnect.

25. The process as recited in claim 23, wherein said depositing a silicon dioxide layer comprises using a TEOS or silane source in a plasma enhanced chemical vapor deposition reactor chamber maintained at a temperature in the range of approximately 200 to 500° C. and a pressure of less than approximately 2 torr.

26. The process as recited in claim 23, wherein said depositing a silicon nitride layer comprises reacting ammonium and silane in a chemical vapor deposition reactor chamber maintained at a temperature in the range of less than approximately 500° C. and a pressure of less than approximately 2 torr.

* * * * *